United States Patent
Boday et al.

(10) Patent No.: US 10,301,429 B2
(45) Date of Patent: May 28, 2019

(54) PHOTORESPONSIVE HEXAHYDROTRIAZINE POLYMERS

(71) Applicant: International Business Machines Corporation, Armonk, NY (US)

(72) Inventors: Dylan J. Boday, Austin, TX (US); Jeannette M. Garcia, San Leandro, CA (US); James L. Hedrick, Pleasanton, CA (US); Jason T. Wertz, Pleasant Valley, NY (US); Rudy J. Wojtecki, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 15/445,628

(22) Filed: Feb. 28, 2017

(65) Prior Publication Data

US 2017/0226262 A1 Aug. 10, 2017

Related U.S. Application Data

(62) Division of application No. 15/016,610, filed on Feb. 5, 2016, now Pat. No. 9,828,467.

(51) Int. Cl.
| | |
|---|---|
| *C08G 12/30* | (2006.01) |
| *C08G 73/06* | (2006.01) |
| *C08G 12/08* | (2006.01) |
| *G03F 7/038* | (2006.01) |
| *G03F 7/20* | (2006.01) |
| *G03F 7/30* | (2006.01) |
| *C08G 73/00* | (2006.01) |

(52) U.S. Cl.
CPC ......... *C08G 73/0644* (2013.01); *C08G 12/08* (2013.01); *C08G 73/065* (2013.01); *G03F 7/038* (2013.01); *G03F 7/20* (2013.01); *G03F 7/30* (2013.01)

(58) Field of Classification Search
CPC ....................................................... C08G 12/30
USPC ....................................................... 528/245
See application file for complete search history.

(56) References Cited

U.S. PATENT DOCUMENTS

| | | |
|---|---|---|
| 2,889,277 A | 6/1959 | Hughes |
| 3,340,232 A | 9/1967 | Smith et al. |
| 3,349,779 A | 10/1967 | Leonard et al. |
| 3,598,748 A | 8/1971 | Hirosawa |
| 3,884,702 A | 5/1975 | Koshimo et al. |
| 3,957,742 A | 5/1976 | Kveton |
| 4,106,904 A | 8/1978 | Oude Alink et al. |
| 4,146,160 A | 3/1979 | Takasuga |
| 4,224,417 A | 9/1980 | Hajek et al. |

(Continued)

FOREIGN PATENT DOCUMENTS

| | | |
|---|---|---|
| CN | 101265255 A | 9/2008 |
| EP | 2636697 A1 | 9/2013 |

(Continued)

OTHER PUBLICATIONS

Jeanette M. Garcia et al., Recyclable, Strong Thermosets and Organogels via Paraformaldehyde Condensation with Diamines, Science AAAS, vol. 344, May 16, 2014, pp. 732-735.

(Continued)

*Primary Examiner* — Duc Truong
(74) *Attorney, Agent, or Firm* — Patterson + Sheridan, LLP (57) ABSTRACT

This disclosure describes new compositions and methods related to photoresponsive poly(hexahydrotriazines) and related polymers.

20 Claims, 3 Drawing Sheets

(56) References Cited

U.S. PATENT DOCUMENTS

| | | | |
|---|---|---|---|
| 4,225,481 | A | 9/1980 | Wagner |
| 4,301,262 | A | 11/1981 | Wagner et al. |
| 4,877,451 | A | 10/1989 | Winnik et al. |
| 5,102,970 | A | 4/1992 | Wang |
| 5,112,796 | A | 5/1992 | Iannicelli |
| 5,268,193 | A | 12/1993 | Beuhler et al. |
| 5,336,925 | A | 8/1994 | Moss et al. |
| 5,674,377 | A | 10/1997 | Sullivan, III et al. |
| 5,830,243 | A | 11/1998 | Wolak et al. |
| 5,840,369 | A | 11/1998 | Maruta et al. |
| 5,976,710 | A | 11/1999 | Sachdev et al. |
| 6,605,353 | B2 | 8/2003 | Okada |
| 7,026,032 | B2 | 4/2006 | Lee et al. |
| 7,351,784 | B2 | 4/2008 | Lehman, Jr. |
| 7,384,434 | B2 | 6/2008 | Malfer et al. |
| 7,504,460 | B2 | 3/2009 | Basheer et al. |
| 7,695,643 | B2 | 4/2010 | Fritzsche et al. |
| 8,262,949 | B2 | 9/2012 | Fritzsche et al. |
| 8,586,735 | B2 | 11/2013 | Vogel et al. |
| 9,243,107 | B2 | 1/2016 | Hedrick et al. |
| 9,512,332 | B2 | 12/2016 | Boday et al. |
| 9,598,608 | B2 | 3/2017 | Boday et al. |
| 2009/0039018 | A1 | 2/2009 | Jordi et al. |
| 2010/0107476 | A1 | 5/2010 | Cosimbescu |
| 2012/0049308 | A1 | 3/2012 | Nishimura et al. |
| 2015/0104579 | A1 | 4/2015 | Hedrick et al. |
| 2016/0152320 | A1 | 6/2016 | Kling et al. |
| 2016/0297931 | A1 | 10/2016 | Boday et al. |
| 2016/0300644 | A1 | 10/2016 | Boday et al. |

FOREIGN PATENT DOCUMENTS

| | | |
|---|---|---|
| FR | 2292996 A1 | 6/1976 |
| GB | 928112 A | 6/1963 |
| GB | 1463900 A | 2/1977 |
| GB | 1531578 A | 11/1978 |
| WO | 0166614 A2 | 9/2001 |
| WO | 0198388 A1 | 12/2001 |
| WO | 0226849 a1 | 4/2002 |
| WO | 2015051715 A1 | 4/2015 |
| WO | 2015/123329 A1 | 8/2015 |

OTHER PUBLICATIONS

Geng, et al., "Nanoindentation behavior of ultrathin polymeric films," Polymer 46 (2005) 11768-11772; Oct. 19, 2005. [Abstract Only] [Available Online].

Ferrar, "Reactions of Formaldehyde with Aromatic Amines," J. Appl. Chem, 14, 1964, 389-399. [Abstract Only] [Available Online].

Elbert, et al. "Conjugate Addition Reactions Combined with Free-Radical Cross-Linking for the Design of Materials for Tissue Engineering," Biomacromolecules 2001, 2, 430-441; Published on Web Mar. 3, 2001 [Abstract Only].

Raquel Lebrero et al., Odor abatement in biotrickling filters: Effect of the EBRT on methyl mercaptan and hydrophobic VOCs removal, Bioresource Technology, Special Issue: Innovative Researches on Algal Biomass,vol. 109, Apr. 2012, pp. 38-45 [Abstract Only] [Available Online].

T. Okita, Filter method for the determination of trace quantities of amines, mercaptans, and organic sulphides in the atmosphere, Atmospheric Environment (1967), vol. 4, Issue 1, Jan. 1970, pp. 93-102 [Abstract Only].

D.R. Anderson et al., Thermally resistance polymers containing the s-triazine ring, Journal of Polymer Science Part A-1: Polymer Chemistry, vol. 4, Issue 7, pp. 1689-1702 [Abstract Only].

John Markoff, Error at IBM Lap Finds New Family of Materials, New York Times, May 15, 2014, 4 pages.

Wang Yulan et al., Synthesis and Properties of Poly-1, 3, 5-Triazines, Polymer Communications, No. 2, 1984, pp. 117-123 [Abstract Only].

Fabian Suriano et al., Functionalized cyclic carbonates: from synthesis and metal-free catalyzed ring-opening polymerization to applications, Polymer Chemistry, The Royal Society of Chemistry, 2011, Received Jul. 6, 2010, Accepted Aug. 13, 2010, pp. 528-533.

Hemant S. Patel et al. Studies on Synthesis and Characterization of some Novel Aromatic Copolyesters based on s-Triazine, Iranian Polymer Journal, vol. 14, No. 12, 2005, pp. 1090-1098.

Henri Ulrich et al. Reaction of Chloromethyl Ether with Primary Amines, May 1961, pp. 1637-1638.

Search Report and Written Opinion dated Nov. 24, 2015 in corresponding International Application No. PCT/US15/37690, 12 pages.

Hiller et al. "Laser-engravable hexahydrotriazine polymer networks," Mat. Res. Innovat (2002) 6: 179-184. [Abstract only].

Oliver, et al. "Measurement of hardness and elastic modulus by; instrumented indentation: Advances in understanding and; refinements to methodology," J. Mater. Res., vol. 19, No. 1, Jan. 2004, 3-20.

Gagan Kaur, et al. "Photo-Reversible Dimerisation Reactions and their Applications in Polymetric Systems" Polymer Chemistry. 2014. [Abstract Only] [Available Online] http://pubs.rsc.org/en/content/articlelanding/2014/py/c3py01234d#!div/Abstract.

Stafford, et al., "A buckling-based metrology for measuring; the elastic moduli of polymeric thin films," Nature Materials_Aug. 3, 2004, 545-550;Published online: Jul. 11, 2004 [Abstract Only].

Singh, et al., "Ultrasound mediated Green Synthesis of Hexa-hydro Triazines," J. Mater. Environ. Sci. 2 (4) (2011) 403-406.

U.S. Appl. No. 15/016,610 entitled "Photoresponsive Hexaydrotriazine Polymers," filed Feb. 5, 2015.

PHOTORESPONSIVE HEXAHYDROTRIAZINE POLYMERS

This application is a DIV of Ser. No. 15/016,610 filed Feb. 5, 2016 now U.S. Pat. No. 9,828,467.

FIELD

The present disclosure relates to new compositions and methods related to polyhexahydrotriazines and related polymers. The compositions and methods described herein are useful for removable and recyclable coatings and for photoresists used in electronic applications.

BACKGROUND

Poly(hexahydrotriazine) polymers (PHTs) are an emerging class of high strength engineering thermoset polymers that have a unique combination of properties. They have high modulus, solvent resistance, and resistance to environmental stress cracking, yet they can be easily recycled by decomposition to monomers in a strong acid. PHTs may be obtained from heat treatment of a poly(hemiaminal) (PHA) polymer, which may be dissolved in a polar solvent. This enables the preparation of PHT films by solvent casting.

A new subset of PHAs and PHTs may be altered by ultraviolet (UV) irradiation of photoresponsive groups bonded to a PHA or a PHT polymer chain and/or a PHT polymer network. The photoresponsive groups engage in the bonding and/or debonding of portions of the polymer and/or the greater polymer network when exposed to UV light. Some of these photo-induced chemical reactions are referred to as photodimerisation reactions. Reactions of this type may proceed by either a [4π+4π] or [2π+2π] cycloaddition mechanism that can be reversed upon application of an appropriate wavelength of light. In the case of the [2π+2π] cycloaddition reaction, photodimerisation occurs between two alkenes to form a cyclobutane dimer. Some examples of small molecules and photodimerisation reactions are presented in FIG. 1, including the respective wavelengths of light that may be used in the photoreversible reactions.

The new photoresponsive PHAs and PHTs presented herein uniquely provide a rigid high modulus and chemically resistant thermoset polymer and that may be reversibly altered by UV irradiation. Processing of such photoresponsive polymers may be non-destructive and may be performed in localized areas of a polymer film to create patterns in the polymer film.

SUMMARY

Described herein is a polyhexahydrotriazine (PHT) with a plurality of trivalent hexahydrotriazine groups having the structure and a plurality of phenyl groups having the structure and wherein each wavy bond site of a given hexahydrotriazine group is covalently linked at a respective wavy bond site of a phenyl group, and each wavy bond site of a given phenyl group is covalently linked at a respective wavy bond site of a hexahydrotriazine group, and wherein at least one of A, B, C, D, and E is a photoreactive group. Additionally, at least one of A, B, C, D, or E is a bridging group between at least two hexahydrotriazine groups. Additionally, least one of A, B, C, D, and E absorbs ultraviolet radiation, and at least one of A, B, C, D, and E comprises a reaction product of ultraviolet radiation absorption. The reaction product is a product of a photoreversible reaction, such as a cyclic carbon group, or a cycloaliphatic carbon group that is the reaction product of a [2π+2π] cycloaddition reaction or a [4π+4π] cycloaddition reaction. The cycloaliphatic carbon group may be a cyclobutane group that is a photoreaction product of at least two carbon-carbon double bonds that may be resonance stabilized. Further provided is a PHT wherein at least one of A, B, C, D, and E comprises a carbon-carbon double bond, wherein at least one carbon-carbon double bond is resonance stabilized and/or one conjugated carbon-carbon double bond from a photo-cleavage reaction, such as a reaction product of a cyclobutane photo-cleavage reaction.

A method is also disclosed for producing a cured photoreactive polymer, that includes forming a reaction mixture comprising a polar solvent, paraformaldehyde, and an aminobenzene compound comprising photoreactive groups; and heating the mixture at a temperature from about 50° C. to about 280° C. to form a cured photoreactive polymer. The cured photoreactive polymer is a poly(hexahydrotriazine) polymer. The method provides for an aminobenzene compound comprises at least two amine groups and at least one photoreactive group that is selected from the group consisting of: carbon-carbon double bonds and cyclic carbon groups. The cyclic carbon group may be a reaction product of a [2π+2π] cycloaddition reaction.

BRIEF DESCRIPTION OF THE SEVERAL VIEWS OF THE DRAWINGS

So that the manner in which the above recited features of the present disclosure can be understood in detail, a more particular description of this disclosure, briefly summarized above, may be had by reference to embodiments, some of which are illustrated in the appended drawings and in the body of the specification. It is to be noted, however, that the appended and embedded drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures and drawings. It is contemplated that elements disclosed in one embodiment may be beneficially utilized on other embodiments without specific recitation.

DETAILED DESCRIPTION

Stimuli-responsive polymeric systems including photoresponsive polymers (PRPs) are used to fabricate smart functional materials for use in a variety of technological and consumer applications. Photoresponsive polymers are useful due to their responses upon the application of light, such as UV light, which may initiate and cause the non-destructive bonding and debonding of chemical structures within a polymer network. Light activated chemical reactions of PRPs may be advantageously performed with a PRP in the solid, glassy, rubbery, or liquid state, and at ambient temperatures. Construction of photoresponsive polymeric networks may be achieved using photoreversible reactions such as photodimerisation.

Disclosed herein are new PHT polymers that combine the rigidity and high modulus of thermoset polymers, with photoresponsive and photoreversible chemical groups that allow the polymer to be structurally altered when irradiated with UV light. In some embodiments of this disclosure, PHAs and PHTs may be structurally altered by photochemical modification in localized areas of the material using patterned mask(s), such as those used to create patterns in conventional photoresist materials. Useful photoresponsive groups chemically bonded to polymers containing hexahydrotriazine groups may be selected from those groups that undergo bonding and debonding in the presence of UV light at certain wavelengths. These groups may include, but are not restricted to anthracene, cinnamic acid, coumarin, thymine, and stilbene groups, which may react by either a [4π+4π] or [2π+2π] cycloaddition mechanism. Such a reaction may be reversed to reproduce the initial or starting chemical groups upon application of an appropriate wavelength of light. Reaction example 1 illustrates one method for forming a photoresponsive PHT that contains conjugated carbon-carbon double bonds that may undergo [2π+2π] cycloaddition reactions:

Reaction example 1 involves the use of the free base form of 4,4'-diaminostilbene, which contains a photo-labile and resonance stabilized double bond and aminobenzene groups. We note that in this disclosure, aminobenzene, phenylamine, and aniline are the same compound. Reference to "an aminobenzene", "aminobenzenes", and "aminobenzene compounds" does not only refer to the single compound aminobenzene, but also includes all varieties of substituted aminobenzenes, that are molecules useful in the synthesis of PHT materials. The hydrochloride salt of 4,4'-diaminostilbene used in reaction example 1, is available from Sigma-Aldrich Chemical Co, St. Louis, Mo., USA.

In one embodiment, a photoresponsive PHT, such as that exemplified in reaction example 1, may be produced as follows: a temperature controlled reaction vessel containing a magnetic stir bar and padded with dry nitrogen may be charged with dry and degassed N-methylpyrrolidone (NMP) solvent (1.5 mL), 4,4'-diaminostilbene (1 mmol) and paraformaldehyde (0.1 g, 3.33 mmol). A useful ratio of aromatic amine to paraformaldehyde (PF) is approximately 0.5 mole aromatic amine:1.25 mole PF. The components may then be stirred at 50° C. until the solution is clear (~15 minutes). This produces an intermediate poly(hemiaminal) (PHA) material that contains photoresponsive groups, such as resonance stabilized carbon-carbon double bonds, as illustrated in reaction example 2

Reaction example 2

In one embodiment, a PHA material, such as that produced in reaction example 2, may be applied to an electronic article using a technique such as spin-coating or spray coating. After application of the PHA material, the film or coating may be reacted with UV light, and then may be converted to a PHT polymer upon further heating. In another embodiment, the photoresponsive polymer material may be a mixture of PHA and PHT polymers. In one embodiment, a photoresponsive PHA coating may be converted to a high modulus photoresponsive PHT by depositing a PHA solution on a glass microscope slide (with 80 μm thickness aluminum tape boundaries) using a glass Pasteur pipette. The following thermal treatment may then be used to drive off the solvent and transform the PHA film to a PHT film: 50° C. for 1 hour, 50° C. to 110° C. over 1 hour, 110° C. for 1 hour, 110° C. to 200° C. over 1 hour, and then 200° C. for 1 hour, after which time the PHT film may be cooled to ~23° C. The aluminum tape may then be peeled off the slide and a photoresponsive PHT film may be isolated by floatation from the glass slide by soaking in deionized water. In another embodiment, a photoresponsive PHT film may be well adhered to a quartz substrate and used directly in photodimerisation experiments. We note that equipment other than the specific equipment described in the embodiment may be used, and that the reaction may be performed at larger scales. Mechanical stirring or flow stirring may be used for mixing instead of a magnetic stirrer, and any suitable process may be used to convert PHA to PHT so long as the processing temperatures are observed.

Photodimerisation or photoreaction of the photoresponsive PHT polymer produced from reaction example 1 is illustrated by reaction example 3, wherein the photoresponsive PHT polymer from reaction example 1, containing resonance stabilized carbon-carbon double bonds, reacts with adjacent resonance stabilized carbon-carbon double bonds, to form a photoresponsive PHT polymer containing cyclobutane groups:

Reaction example 3

>300 nm / <250 nm

As shown in reaction example 3, dimerisation or reaction of the photoresponsive PHT from reaction example 1 to form cyclobutane links and groups may be achieved by irradiation of a photoresponsive PHT film by UV light of a wavelength from about 300 nm to about 400 nm in a dry oxygen free environment. Recovery of the photoresponsive PHT containing resonance stabilized carbon-carbon double bonds may achieved by irradiation of the photoresponsive PHT film containing cyclobutane groups with UV light of a wavelength from about 190 nm to about 250 nm in a dry oxygen free environment. Generally, a UV radiation at a radiant exposure level of between about 0.1 J/cm$^2$ and about 500 J/cm$^2$ for a period of time of between about 0.1 seconds and about 100 seconds may be used in the forward and reverse processes. The UV radiation dosage and intensity may be adjusted by those skilled in the art to achieve the desired level of conversion, which may depend of film thickness and other factors. The UV radiation may be provided by any UV source, such as mercury microwave arc lamps (e.g., H bulb, H+ bulb, D bulb, Q bulb, and V bulb type lamps), pulsed xenon flash lamps, high-efficiency UV light emitting diode arrays, and UV lasers. Suitable optics may be employed, if desired, to pattern the radiation or confine exposure only to desired areas. The UV radiation may have a wavelength between about 170 nm and about 500 nm. A useful range of temperatures for the photoreactions may be from about −25° C. to about 25° C.

In one embodiment, a cracked or otherwise structurally defective photoresponsive PHT polymer, such as that exemplified by the PHT material containing resonance stabilized carbon-carbon double bonds produced in reaction example 1, may be healed by irradiation with UV light. This may be achieved by the formation of cyclobutane groups which bridge the two opposing surfaces. The formation and propagation of a crack or fracture, inside a polymeric material or on its surface, involves breaking of chemical bonds or polymer chains. Self-healing or self-repair requires formation of new chemical bonds between the crack surfaces, such as the formation of cyclobutane groups from the UV irradiation of a photoresponsive PHT containing resonance stabilized carbon-carbon double bonds. In a related embodiment, photoresponsive PHTs may contain pendant photoresponsive functionality or chemical groups. The pendant photoresponsive groups engage in photo-polymerization or dimerisation reactions when irradiated with UV light and may bridge or heal two opposing surfaces in a crack. It is expected that pendant groups have greater degrees of rotational and translational freedom to engage in photodimerisation reactions and may thus be advantageous in terms of efficacy and photo-yield. Such pendant photoresponsive groups may therefore provide enhanced "self-healing" properties for repairing cracks in PHT materials.

Reaction example 4 illustrates an alternate method for forming a photoresponsive PHT that contains cyclobutane groups. Here, a photoresponsive aminobenzene containing molecule or oligomer is produced prior to formation of a hexahydrotriazine containing polymer:

Reaction example 4

The photoresponsive molecule or oligomer containing aminobenzene groups and cyclobutane groups as shown is tetrafunctional, and may be reacted to form photoresponsive PHT networks as shown in reaction example 5.

Reaction example 5

-continued

The pathway to photoresponsive PHTs, as illustrated in reaction example 5, may be advantageous because the cyclobutane groups are formed first, and the formation thereof does not depend on the proximity of two resonance stabilized carbon-carbon double bonds, in contrast to the reaction pathway shown in reaction example 3, which involves the photodimerisation or crosslinking of a polymer network with restricted freedom of movement and steric hindrance. It is suggested that the photoresponsive PHT produced by reaction example 5 may provide greater control over the degree of crosslinking or dimerisation, both in the forward and reverse directions, as the photoactive sites are preformed, and then integrated into the greater PHT polymer network after polymerization.

Figure 1:
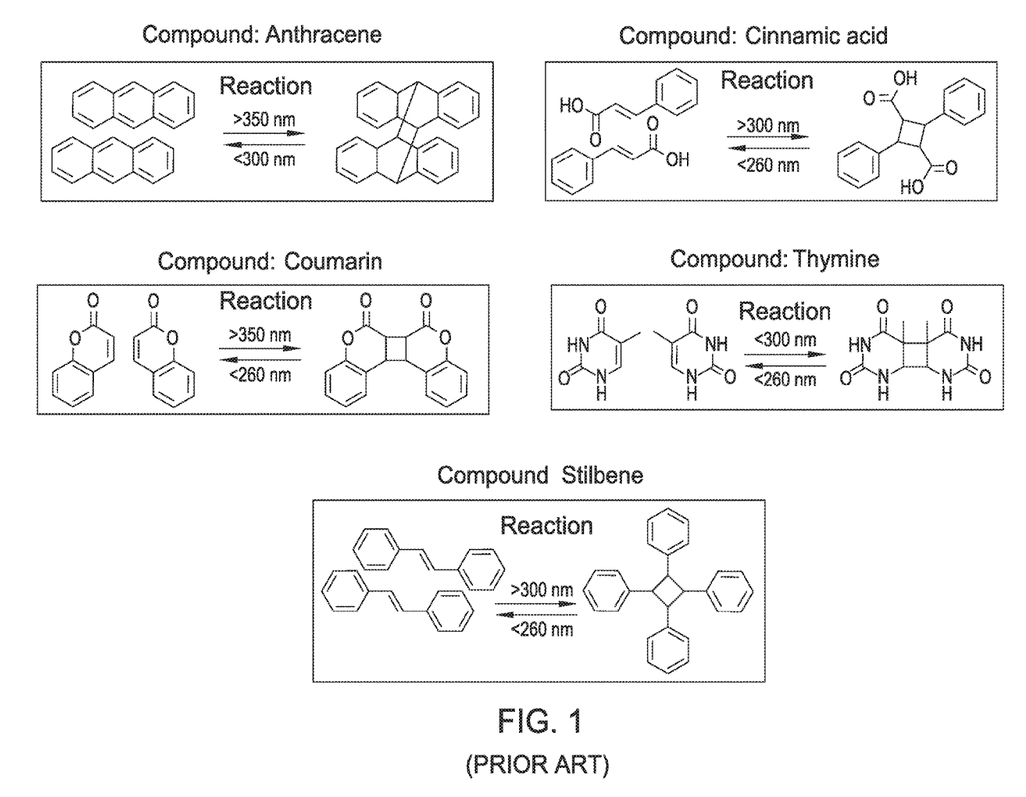
FIG. 1 shows some examples of photoreactive small molecules and photodimerisation reactions.

In addition to a [2π+2π] cycloaddition reactions used to create crosslinks or cyclic carbon groups such as cyclobutane groups, [4π+4π] cycloaddition reactions may be used to create crosslinks or cyclic carbon groups other than cyclobutane groups. A useful group for such a [4π+4π] cycloaddition reaction is an anthracene polycyclic aromatic group, which may be used to create a crosslinks or cyclooctane groups (FIG. 1). In one embodiment, an anthracene diamine may be combined with paraformaldehyde per reaction example 1 to produce a photoresponsive polymer containing anthracene groups. After UV irradiation at wavelength of about 350 nm or greater, a new photoresponsive polymer containing cyclooctane groups may be produced.

Figure 2:
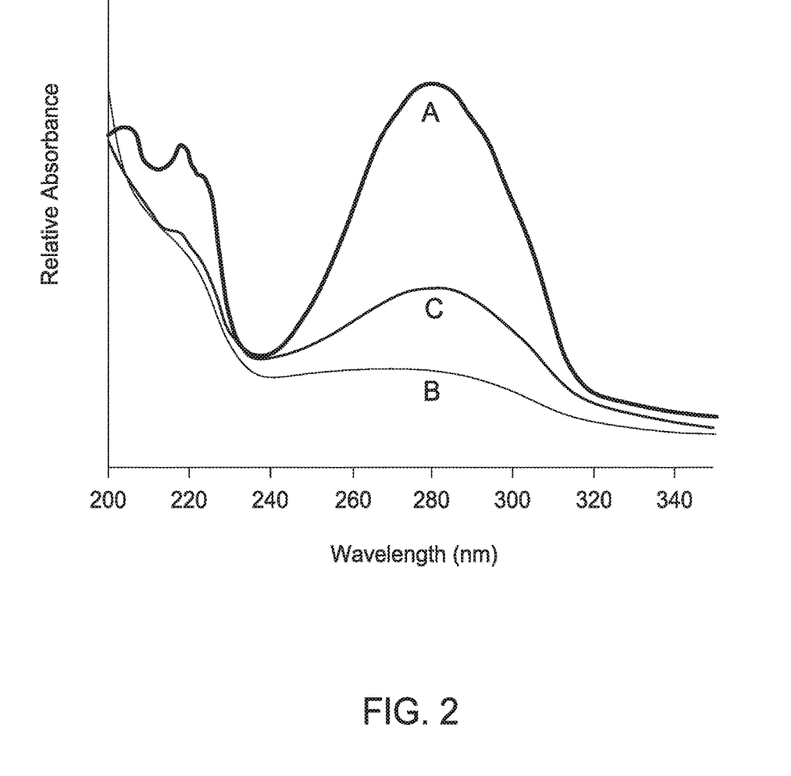
FIG. 2 is a series of UV-visible spectroscopy absorbance plots.

The percent conversion of resonance stabilized carbon-carbon double bonds to cyclobutane groups or the reverse photoreaction may be monitored by techniques such as nuclear magnetic resonance spectroscopy and UV-visible spectroscopy techniques. In one embodiment, the percent conversion of carbon-carbon double bonds to form aliphatic cyclobutane groups, or the reverse reaction, may be determined by UV-visible spectroscopy, which may quantitatively detect differences between the UV absorption characteristics of the starting resonance stabilized alkene and the corresponding cyclobutane photoproduct, or the reverse reaction, to reform the carbon-carbon double bonds. For example, the electronic conjugation of resonance stabilized carbon-carbon double bonds, such as that exemplified by molecules such as 4,4'-diaminostilbene, produces strong UV absorption at certain wavelengths, such as those from about 260 nm to about 300 nm, and as depicted by the "A" curve in FIG. 2. After dimerisation, or the formation of cyclobutane groups, conjugation is destroyed and the absorbance of the irradiated sample may be reduced significantly, as illustrated by curve "B" in FIG. 2. The reverse reaction, involving cyclobutane cleavage, and the restoration of conjugated bonds, is reflected in the increase of absorption from about 270 nm to about 300 nm region, as shown by curve "C" in FIG. 2. Therefore, by monitoring changes in the UV absorbance at particular wavelengths, one may determine the extent of photodimerisation to form cyclic structures, or the reverse reaction, wherein conjugated carbon-carbon double bonds are restored.

In one embodiment of this disclosure, photoresponsive PHAs and PHTs may be patterned using photolithography. Photolithography is a process used in the electronics industry to create specific patterns or regions in photoreactive materials (photoresists) in the production of electronic components and integrated circuits. The photoresist may be a polymer material sensitive to a certain wavelength of electromagnetic radiation, and may be applied through a spin coating process. The photoresist may be a carbon-based polymer sensitive to ultraviolet light, such as a phenolic resin matrix with a diazonapthoquinone sensitizer. Patterning of regions in a photoresist may be created by photolithographic processes as follows: a) layers of a photoresist material are coated onto a substrate, such as a silicon wafer, and b), the photoresist layer is selectively exposed to a form of radiation, such as ultraviolet light, using an exposure tool and a patterned mask to effect the desired exposure of certain areas defined by the photomask pattern, and c), the patterns in the photoresist are formed when the photoresist is developed, usually by the chemical action of a developer. In the case where the irradiated or exposed regions are developer soluble, a positive image of the mask is produced in the resist (positive resist). If the non-irradiated regions are dissolved by the developer, a negative image results (negative resist). Following development, the regions of the substrate no longer covered by photoresist may be removed by plasma etching, thereby replicating the mask pattern in that substrate layer.

Figure 3A:
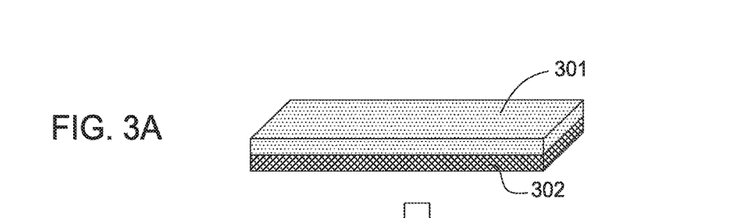
FIGS. 3A-3C show a substrate undergoing a photoresist process that uses a photoresponsive PHT.
Figure 3B:
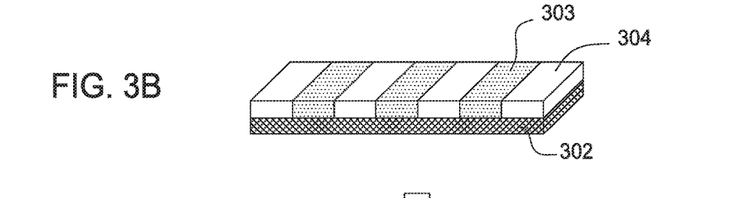
Figure 3C:
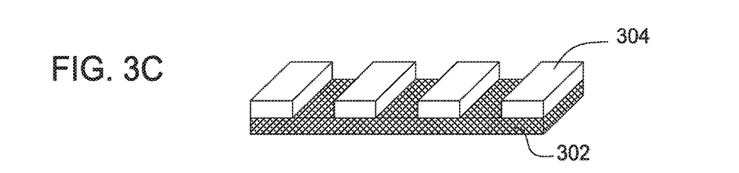

In a similar fashion, photoresponsive PHAs and PHTs may be used as photoresists in the production of electronic articles such as passive components and integrated circuits. As mentioned prior, a liquid PHA material may be applied to an electronic article, patterned with UV light, and then cured by heat treatment to produce a PHT material or a mixture of PHA and PHT materials. Before or after heat curing, the film may be developed to form a patterned photoresponsive polymer disposed over an electronic article. FIGS. 3A-3C illustrate cross-sectional views representing a photoresponsive PHT patterning process 300 according to one embodiment of this disclosure. As shown in FIG. 3A, a photoresponsive PHT 301, disposed over and upon a substrate 302, is exposed to UV radiation from greater than 300 nm using a photomask pattern according to known masking and patterning processes. FIG. 3B illustrates the pattern transferred to the photoresponsive PHT, wherein the PHT film has unexposed areas 303 and UV radiation exposed areas 304. In one embodiment, the 304 areas may contain the reaction product(s) of a [2π+2π] cycloaddition dimerisation reaction, wherein the reaction products contain cyclobutane group crosslinks. FIG. 3C illustrates the PHT patterned substrate after development with a strong acid, such as hydrochloric acid or sulfuric acid, wherein the unexposed PHT 303 may be removed. The process used to remove the unexposed PHT 303 may selectively etch PHT 303 at a greater rate than PHT 304, thus maintaining the desired structural features of PHT 304. In other embodiments, a patterning scheme may involve photo-cleavage of cyclobutane groups and the restoration of the conjugated carbon-carbon double bonds. A further advantage of the use of photoresponsive PHAs and PHTs in a photolithography process is that the photoresponsive polymers contain photosensitive chemical groups integrated or bound to the polymer structure, and thus do not require the addition of a photosensitizer material, such as diazonapthoquinone to cause the photo-response or initiate the photochemistry.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A method for producing a cured photoreactive polymer, comprising:
    forming a reaction mixture comprising a polar solvent, paraformaldehyde, and an aminobenzene compound comprising a photoreactive group; and
    heating the mixture at a temperature from about 50° C. to about 280° C. to form a cured photoreactive polymer.

2. The method of claim 1, wherein the cured photoreactive polymer is a poly(hexahydrotriazine) polymer.

3. The method of claim 1, wherein the aminobenzene compound comprises at least two amine groups.

4. The method of claim 3, wherein the photoreactive group includes at least one of a carbon-carbon double bond or a cyclic carbon group.

5. The method of claim 4, wherein the photoreactive group includes a cyclic carbon group that is a reaction product of a $[2\pi+2\pi]$ cycloaddition reaction.

6. The method of claim 5, wherein the photoreactive group includes a cyclic carbon group that is a reaction product of a $[4\pi+4\pi]$ cycloaddition reaction.

7. The method of claim 1, further comprising performing a photoreaction in at least a portion of the cured photoreactive polymer by exposing the portion of the cured photoreactive polymer to UV light.

8. The method of claim 1, further comprising patterning the cured photoreactive polymer by exposing the cured photoreactive polymer to UV light through a mask.

9. A method for producing a cured photoreactive polymer, comprising:
    forming a reaction mixture comprising a polar solvent, paraformaldehyde, and an aminobenzene compound comprising a photoreactive group that are reaction products of a $[2\pi+2\pi]$ cycloaddition reaction or a $[4\pi+4\pi]$ cycloaddition reaction; and
    heating the mixture at a temperature from about 50° C. to about 280° C. to form a cured photoreactive poly(hexahydrotriazine) polymer.

10. The method of claim 9, wherein the aminobenzene compound comprises at least two amine groups.

11. The method of claim 9, wherein the photoreactive group includes at least one of a carbon-carbon double bond or a cyclic carbon group.

12. The method of claim 9, further comprising performing a photoreaction in at least a portion of the cured photoreactive polymer by exposing the portion of the cured photoreactive polymer to UV light.

13. The method of claim 9, further comprising patterning the cured photoreactive polymer by exposing the cured photoreactive polymer to UV light through a mask.

14. The method of claim 13, further comprising treating the cured photoreactive polymer with a strong acid following exposure to UV light.

15. The method of claim 1, wherein the photoreactive group is selected from the group consisting of anthracenes, cinnamic acids, coumarins, thymines, and stilbenes.

16. The method of claim 9, wherein the photoreactive group is selected from the group consisting of anthracenes, cinnamic acids, coumarins, thymines, and stilbenes.

17. A method for producing a cured photoreactive polymer, comprising:
    forming a reaction mixture comprising a polar solvent, paraformaldehyde, and an aminobenzene compound comprising a photoreactive group that are reaction products of a $[2\pi+2\pi]$ cycloaddition reaction, a reverse $[2\pi+2\pi]$ cycloaddition reaction, a $[4\pi+4\pi]$ cycloaddition reaction, or a reverse $[4\pi+4\pi]$ cycloaddition reaction; and
    heating the mixture at a temperature from about 50° C. to about 280° C. to form a cured photoreactive poly(hexahydrotriazine) polymer.

18. The method of claim 17, wherein the cured photoreactive polymer is a poly(hexahydrotriazine) polymer.

19. The method of claim 17, wherein the photoreactive group includes at least one of a carbon-carbon double bond or a cyclic carbon group.

20. The method of claim 17, wherein the photoreactive group is selected from the group consisting of anthracenes, cinnamic acids, coumarins, thymines, and stilbenes.

* * * * *